INVENTOR.
FREDERIC P. HEIMAN
BY Eugene M. Whitacre
ATTORNEY

Feb. 1, 1966 F. P. HEIMAN 3,233,123

INTEGRATED INSULATED-GATE FIELD-EFFECT TRANSISTOR CIRCUIT ON A SINGLE SUBSTRATE EMPLOYING SUBSTRATE-ELECTRODE BIAS

Filed Feb. 14, 1963 3 Sheets-Sheet 2

INVENTOR.
FREDERIC P. HEIMAN
BY
Eugene M. Whitacre
ATTORNEY

INVENTOR.
FREDERIC P. HEIMAN
BY Eugene M. Whitacre
ATTORNEY

United States Patent Office 3,233,123
Patented Feb. 1, 1966

3,233,123

INTEGRATED INSULATED-GATE FIELD-EFFECT TRANSISTOR CIRCUIT ON A SINGLE SUBSTRATE EMPLOYING SUBSTRATE-ELECTRODE BIAS

Frederic P. Heiman, Highland Park, N.J., assignor to Radio Corporation of America, a corporation of Delaware Filed Feb. 14, 1963, Ser. No. 258,509
7 Claims. (Cl. 307—88.5)

This invention relates in general to electrical circuits including insulated-gate field-effect semiconductor devices.

Insulated-gate field-effect transistors include drain and source electrodes formed in spaced relation on a substrate of semiconductor material, but connected by a channel of controllable conductivity. A gate electrode, insulated from the semiconductor substrate and the channel, is disposed between the source and drain electrodes to control, by field-effect action, the effective conductivity of the channel.

For switching circuits it is highly desirable that the semiconductor devices operate to provide substantially zero drain current for zero bias voltage between the gate and source electrodes, and substantial drain current in response to a turn-on voltage applied between the gate and source electrodes. In practice, it is difficult to reliably build an insulated-gate field-effect device which has substantially zero drain current for zero gate-to-source bias voltage without impairing some of the desirable characteristics of the device. Thus, there is generally a small channel current at zero gate bias. Furthermore, in the fabrication of large batches of field-effect transistors on a single semiconductor substrate for integrated logic switching circuits, or the like, the value of this residual zero bias drain current may vary thus rendering the OFF state of the transistor somewhat indefinite thereby decreasing the efficiency and reliability of the circuit.

In addition to the foregoing, it has been noted that one of the characteristics of an insulated-gate field-effect transistor which limits its speed of response in switching circuits is the drain-to-ground or output capacitance which coacts with the effective resistance of the load to form a resistance-capacitance time constant network. The speed with which this resistance-capacitance circuit charges and discharges is in part determinative of the speed of response of the switching circuit.

It is an object of this invention to provide an improved switching circuit employing an insulated-gate field-effect semiconductor device which exhibits an improved speed of response.

It is another object of the invention to provide an improved integrated circuit including an insulated-gate field-effect semiconductor device wherein the drain current for zero gate bias may be established at substantially zero.

It is still another object of this invention to provide an improved integrated circuit including a plurality of insulated-gate field-effect transistors formed on a single semiconductor substrate wherein the drain current for all of the devices may be established and held at substantially zero in a simple and effective manner without impairing other desirable characteristics of the transistors.

In accordance with the invention the channel or drain current of an insulated-gate field-effect semiconductor device may be reduced to zero by the application of a reverse bias voltage to the substrate electrode with respect to the source and drain electrodes. Where a plurality of devices are formed on a single semiconductor substrate, the reverse bias voltage is applied to the common substrate and is of sufficient value to provide essentially zero drain current in all of the devices, for zero gate-to-source bias voltage.

In addition to the foregoing advantages, the reverse substrate-to-source and substrate-to-drain voltage materially decreases the capacitance between the drain and source electrodes thereby decreasing the response time of the circuit so that the speed of switching from the OFF to the ON states and vice versa is increased.

The novel features which are considered to be characteristic of this invention are set forth with particularity in the appended claims. The invention itself, however, both as to its organization and method of operation as well as additional objects and advantages thereof will best be understood from the accompanying drawings, in which:

Figure 1:
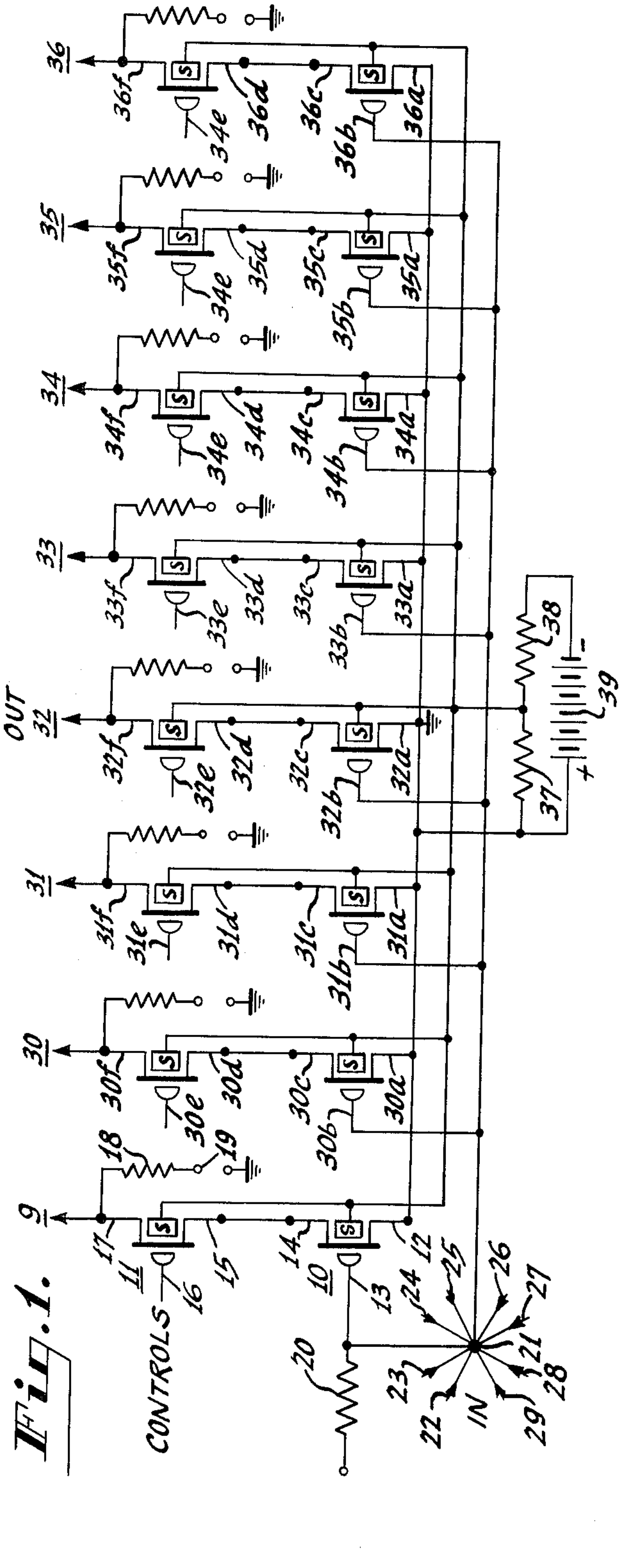
FIGURE 1 is a schematic circuit diagram of an eight neighbor nand circuit (i.e. eight neighboring nand circuits connected as an integrated circuit on a single substrate) embodying the invention.

Referring to the drawings, and particularly to FIGURE 1, a plurality of insulated-gate field-effect transistors are connected to form an eight neighbor nand logic nodal unit. The unit includes eight separate nand gates. The first nand gate 9 includes two field-effect transistors 10 and 11 connected in series. The field-effect transistor 10 includes a source electrode 12, a gate electrode 13 and a drain electrode 14. The transistor 11 includes a source electrode 15, a gate electrode 16 and a drain electrode 17. The gate electrode 16 of the transistor 11 is coupled to a suitable control voltage source such as may be provided by other logic units. For the purposes of the present description, it will be assumed that the gate electrode 16 has a "one" or a positive voltage input, and is biased to its ON or high conductance condition. The drain electrode 17 is connected through a suitable load circuit such as a resistor 18 to the positive terminal of a source of operating potential 19. Suitable utilization circuit means, not shown, may be connected to the drain electrode 17.

The gate electrode 13 of the transistor 10 is connected through a resistor 20 to the positive terminal of a source of biasing potential, not shown. The gate electrode 13 is also connected to a terminal point 21, to which is applied pulses from any one of a number of sources 22, 23, 24, 25, 26, 27, 28 and 29, each of which are referenced to ground. The source electrode 12 is grounded and the drain electrode 14 is connected to the source electrode 15 of the transistor 11.

A "nand" circuit performs the logic reciprocal of that performed by an "and" circuit. In other words, a nand circuit produces a "zero" output when a "one" input is present from each of two input sources. In this case, one of the sources is coupled to the gate electrode of the transistor 11 and the other of the sources is connected to the gate electrode of the transistor 13. If a "one" signal is applied to only one of the gate electrodes 13 and 16, or no "one" signals are present, then a "one" output is derived from the circuit. Stated otherwise, if a positive turn-on pulse is applied to the gate electrode 16 and a second positive turn-on pulse is simultaneously applied to the gate electrode 13, then the output pulse from the drain electrode 17 is at substantially zero potential since the two transistors conduct heavily. However, if either on or both of the transistors 10 and 11 are in their OFF or low conductance condition due to the fact that no positive turn on pulse is applied thereto, then a relatively high positive potential appears at the drain electrode 17.

The circuit of FIGURE 1 includes seven other substantially identical nand circuits 30, 31, 32, 33, 34, 35 and 36. The source, gate and drain electrodes of the bottom transistors of each of these nand circuits are identified by the reference character applied to the particular nand circuit with the letter "*a*," "*b*" and "*c*" respectively. The source, gate and drain electrodes of the upper transistors of each of the nand circuits is identified by the number of the nand circuit with the letter "*d*," "*e*" and "*f*" respectively. The gate electrodes of the lower transistors in each of the nand gates are connected in common to the input terminal 21, whereas the gate electrodes of the upper transistors are connected individually to different control circuits.

Each of the transistors includes a substrate S which is connected in common to a voltage divider comprising a pair of resistors 37 and 38, and a battery 39. The battery 39 is poled so that the substrates are held at a negative potential with respect to ground.

Figure 2:
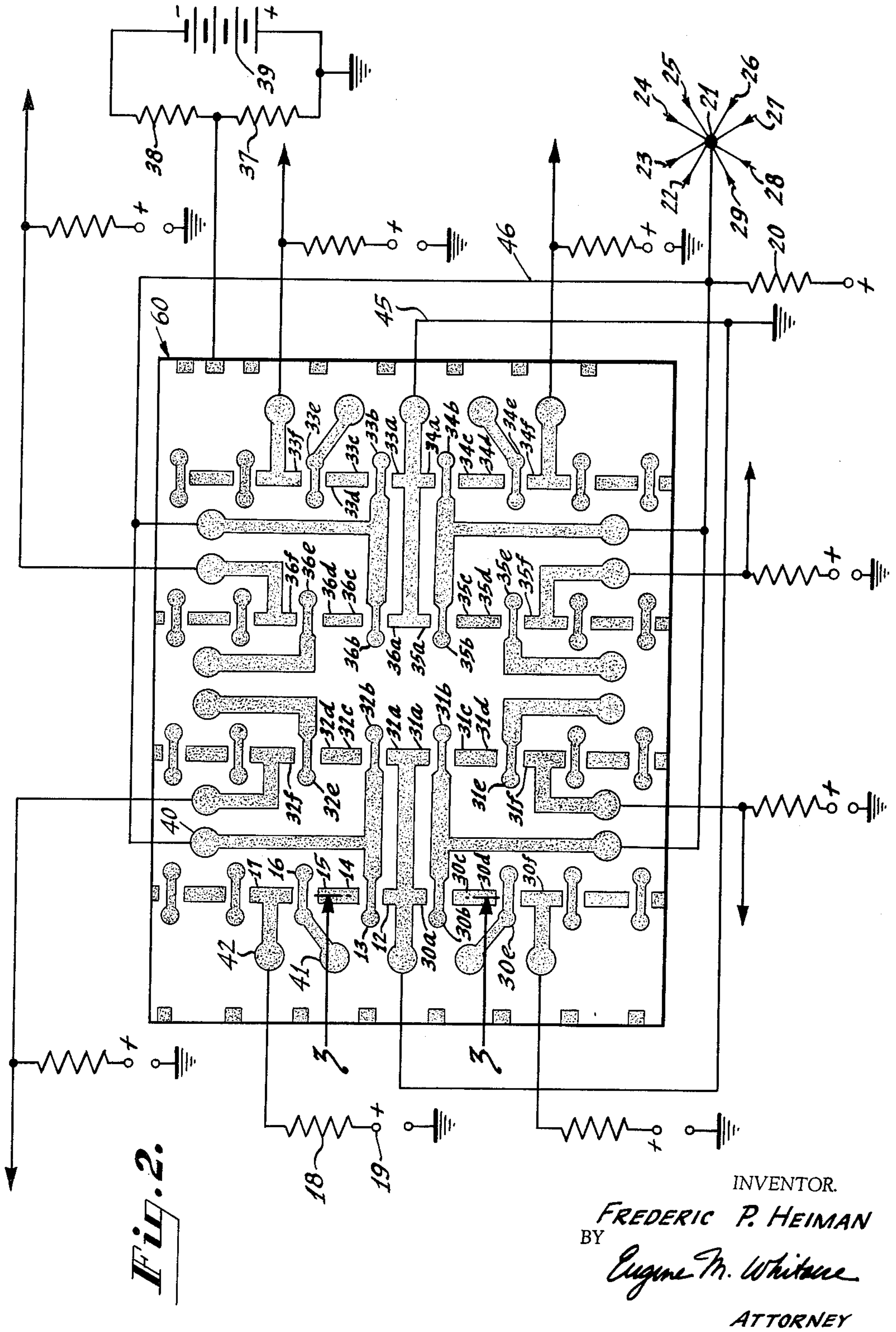
FIGURE 2 is a plan view, greatly enlarged, of an integrated circuit including a plurality of field-effect transistor devices connected as shown in FIGURE 1.

An integrated circuit of the eight neighbor nand logic nodal unit of FIGURE 1 is shown in plan view, greatly enlarged in FIGURE 2, wherein like reference numerals designate the same parts as are identified in FIGURE 1. It will be noted in FIGURE 2 that the source electrode 12 of the transistor 10 forms a part of a conductor which comprises the source electrodes 30*a*, 31*a* and 32*a*. The source electrode 12 is positioned physically adjacent the gate electrode 13 which during the fabrication process is formed as a part of a conductor which serves as the gate electrode 32*b*. Gate electrodes 13 and 32*b* are provided with a conductive terminal connection 40 which is to be connected through external circuit means, to the terminal 21. Gate electrode 13 is positioned physically adjacent an electrode 14–15 which serves as a source electrode for the transistor 11 and as a drain electrode for the transistor 10. The gate electrode 16 and drain electrode 17 which are positioned directly above the source electrode 15 are conductively connected to terminal areas 41 and 42 respectively which are connected by means of external conductors to further circuit means. For example, the terminal 41 is connected to the control voltage source to control the conductivity of the transistor 11, and the terminal area 42 is connected to a resistor 18, and also to utilization circuit means.

The other transistors and their electrodes are correspondingly numbered in FIGURES 1 and 2. An external conductor 45 which is at ground potential connects the source electrodes of the bottom transistors of each of the nand gates in common. A second external conductor 46 connects the gate electrodes of the bottom transistors of the nand gates to the resistor 20 and to the input terminal 21 to which the various input circuits 22, 23, 24, 25, 26, 27, 28 and 29 are connected. The semiconductor substrate 60 on which the electrodes of the various field-effect transistors are formed is connected to the voltage divider 37–38 to receive a negative bias voltage therefrom. The unnumbered dark areas of the integrated circuit of FIGURE 2 are source, gate and drain electrodes of transistors not used in the present circuit.

Figure 3:
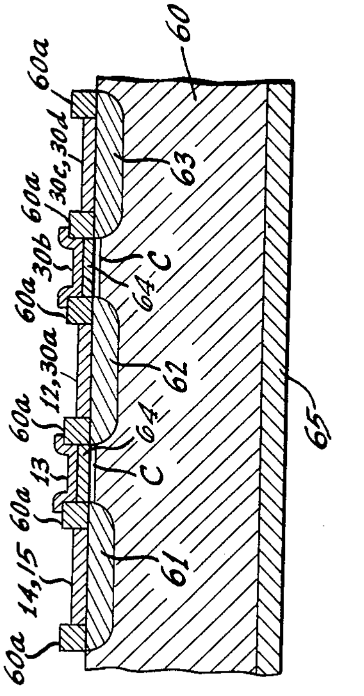
FIGURE 3 is an enlarged cross section view taken along section line 3—3 of FIGURE 2.

An integrated circuit of the type shown in FIGURE 2 may be fabricated in a manner to be described in connection with FIGURE 3. FIGURE 3 is a greatly enlarged sectional view of the transistor 10 and 30*a*, 30*b*, 30*c*. The integrated structure includes a body 60 of semiconductor material. The body 60 may be a single crystal or polycrystalline and may be of any suitable material used in a semiconductor art. For example, the body 60 may be nearly intrinsic silicon, such as for example lightly doped P-type silicon of 100 ohm cm. material.

In the manufacture of the structure shown in FIGURE 3, heavily doped silicon dioxide 60*a* is deposited over the surface of the silicon body 60. The silicon dioxide is doped with N-type impurities. By means of a photo-resist and acid etching or other suitable technique, the silicon dioxide is removed at all locations except where the source or drain regions 61, 62 and 63 are to be formed.

The body 60 is then heated in a suitable atmosphere, such as in water vapor so that the exposed silicon areas are oxidized to form grown dioxide layers 64 at all locations except those overlying the source and drain regions where the deposited silicon dioxide was left undisturbed. During the heating process, impurities from the deposited silicon dioxide layer diffuse into the silicon body 60 to form the various source and drain regions indicated in FIGURE 3 as the regions 61, 62 and 63.

By means of another photo-resist and acid etching or like step, the deposited silicon dioxide over at least a portion of the source-drain diffused regions is removed. Electrodes are formed for the source-drain 14–15 and 12–30*a* and gate regions 13 and 30*b* and conductive terminal areas (e.g. 40, 41 and 42) by evaporation of a conductive material by means of an evaporation mask. The conductive material evaporated may be chromium and gold in the order named for example, but other suitable conductive materials may be used.

The finished wafer appears in plan view as shown in FIGURE 2 in which the dark zones are representative of the conductive electrode and external circuit terminal areas. The gate electrodes 13 and 30*b* overlie a layer of grown silicon dioxide and are hence insulated from the substrate silicon body 60 and from the source and drain electrodes 12–14 and 30*a*–30*c*. The silicon wafer 60 is mounted on a conductive base or header 65 as shown in FIGURE 3.

The layer of grown silicon dioxide 64 on which the gate electrodes are mounted, overlies an inversion layer or channel C conductively connecting the source and drain regions. The charge carriers are electrons which flow from the source to the drain in this thin channel region close to the surface. Because the gate electrode is insulated from the source-drain and substrate, the input resistance of the device at low frequencies is very high and on the order of $10^{14}$ ohms.

Figure 4:
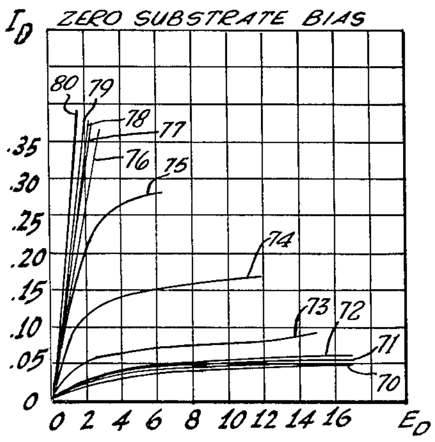
FIGURE 4 is a graph showing the drain-current versus drain-voltage characteristics of the field-effect transistors incorporated in the integrated circuit of FIGURE 2.

FIGURE 4 is a family of curves 70–80 illustrating the drain current versus drain voltage (drain to source voltage) characteristic of any of the transistors of the integrated circuit of FIGURE 2 for different values of gate-to-source voltage and for zero substrate-to-ground voltage. A feature of an insulated-gate field-effect transistor is that the zero bias characteristic can be at any one of the curves 70–80 shown in FIGURE 4 with the curves above the zero bias curve representing positive gate voltage and the curves below the zero curve representing negative gate voltages relative to the source. The location of the zero bias curve can be selected by control of the processing of the transistor during its manufacture. For example, by controlling the time and/or temperature of the step of the process during which the silicon dioxide layer 64 is grown, the number of free charge carriers in the channel of the device can be controlled. The longer the transistor is heated and the higher the temperature, the more the drain current for a given amount of drain voltage for zero bias between the source and gate electrodes. For instance, an oxide growth for 4 hours at 900° C. in a water vapor atmosphere will produce a zero gate bias drain current of approximately 0.5 milliamp. This current can be reduced by a factor of 10 by a subsequent bake in dry nitrogen for 1 hour at 1000° C.

For switching circuit applications it is desirable that the drain current for zero gate-to-source bias voltage be as small as possible. In practice it is difficult to completely eliminate all drain current at zero gate bias voltage by chemical or other processing means without impairing some of the desirable characteristics of the device. Thus, there is usually a small channel current at zero gate voltage as is indicated by the curve 70. Furthermore, in the fabrication of large batches of transistors such as shown in FIGURE 2, the value of this residual zero bias channel current may vary greatly from transistor to transistor. This means that the relative output voltage from the various nand circuit for a given input may also vary greatly.

A negative substrate bias voltage source as shown in FIGURES 1 and 2 is provided sufficient value to reduce the zero bias drain current to substantially zero in all of the transistors and provides a mechanism for controlling the amount of gate drive necessary before any of the devices can be switched from their low conductance condition to their high conductance. The "delay" provided by a high negative substrate voltage can be overcome or partially overcome by a positive gate bias voltage such as provided through the resistor 20. A similar fixed positive voltage may also be applied to the upper transistors of the nand gates. It should be noted that all conductivity types may be reversed in the fabrication of an integrated circuit yielding a complementary device which requires a negative drain voltage and a positive voltage applied to the substrate.

Figure 5:
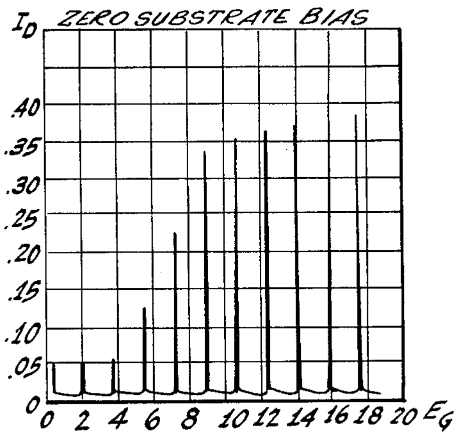
FIGURE 5 is a graph of the drain-current versus gate-voltage characteristic (i.e. transfer characteristic) of the field-effect semiconductor devices used in the circuit of FIGURE 2.
Figure 6:
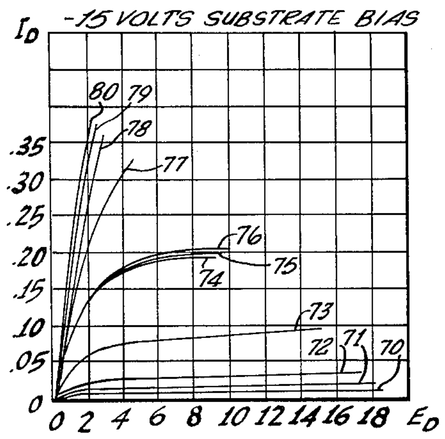
FIGURE 6 is a graph of the drain-current versus drain-voltage characteristics of the semiconductor devices of FIGURE 2 with a negative voltage applied to the semiconductor substrate on which the devices are formed.
Figure 7:
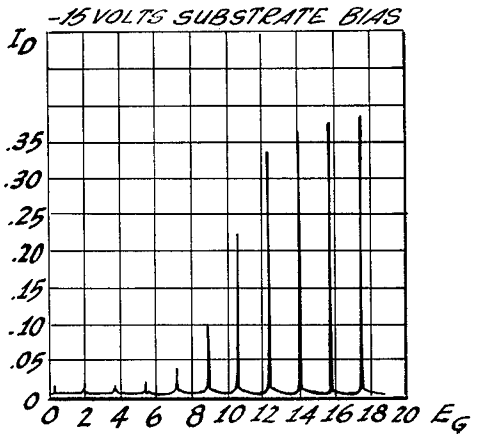
FIGURE 7 is a graph of the drain-current versus gate-voltage (i.e. transfer characteristic) of the devices shown in FIGURE 2 with a negative bias applied to the substrate electrode.

The drain current versus drain voltage characteristic of the various devices is shown in FIGURE 4, and the transfer characteristics of the devices (i.e. drain-current versus gate-voltage under conditions of constant drain-voltage) is shown in FIGURE 5. FIGURES 4 and 5 are representative of the conditions when zero bias is applied to the substrate electrode with respect to ground. FIGURES 6 and 7 represent the same curves respectively with a substrate bias of about minus 15 volts. The curves of FIGURES 4–7 were taken with a circuit including one of the devices of FIGURE 2 connected through a load resistance of 50,000 ohms to a drain voltage source of 20 volts. The drain current scale represents .05 milliamp per division on the ordinate. The drain voltage scale in FIGURES 4 and 6 is two volts per division and the gate was varied from zero to plus 20 volts in two volt increments.

As can be seen from the graph of FIGURE 5, a rather substantial amount of drain current flows when the gate bias is zero, and the transition between the low current condition and high current condition of the device is rather gradual, producing a gradual or indefinite type of switch. On the other hand, with a negative voltage applied to the substrate on which the several field-effect transistors are formed, the drain current for zero gate bias voltage is very small and a relatively sharper transition is provided between the low current and high current conditions of the switch.

In addition to the foregoing, it may be noted that a pair of rectifying junctions exist between the drain and the substrate electrodes and between the source and substrate electrodes with the anode of these diodes at the substrate electrode. Hence, as the negative bias voltage on the substrate is increased these diodes are made less conductive and exhibit less capacitance. Under normal values of expected substrate bias voltage such as −15 volts indicated in FIGURES 6 and 7 the amount of output capacitance exhibited between the drain and source is reduced by a factor of 10 to 1 as compared to the condition with zero substrate bias voltage. This is advantageous in that charging and discharging time constants of the output capacitance taken in combination with the load resistance of FIGURE 1 is reduced, thereby enhancing or increasing the speed of switching.

What is claimed is:

1. An integrated electrical circuit including a plurality of insulated-gate field-effect transistors each having source, drain and gate electrodes formed on a single substrate of semiconductor material comprising:
   means for biasing said substrate to a potential with respect to said source electrode to reduce the source-to-drain current to substantially zero in the absence of input signals applied between said gate and source electrodes.

2. An integrated electrical circuit including a plurality of insulated-gate field-effect transistors each having source, drain and gate electrodes formed on a single substrate of P-type semiconductor material comprising:
   means for biasing said substrate to a negative potential with respect to said source and drain electrodes to reduce the source-to-drain current to substantially zero for zero gate-to-source potential.

3. An integrated electrical circuit including a plurality of insulated-gate field-effect transistors each having source, drain and gate electrodes formed on a single substrate of N-type semiconductor material comprising:
   means for biasing said substrate to a positive potential with respect to said source and drain electrodes to reduce the source-to-drain current to substantially zero for zero gate-to-source potential.

4. A switching circuit including an insulated-gate field-effect transistor having source, drain and gate electrodes formed on a substrate of semiconductor material and having rectifying junctions between said substrate and said drain electrode and between said substrate and said source electrode,
   circuit means connecting said transistor for operation between a low source-to-drain current condition, and a relatively high source-to-drain current condition in response to applied input signals, and
   means for applying a voltage to said substrate to reverse bias said rectifying junctions to decrease the capacity thereof and thereby increase the speed of response of said switching circuit.

5. A switching circuit including an insulated-gate field-effect transistor having source, drain and gate electrodes formed on a substrate of semiconductor material and having rectifying junctions between said substrate and said drain electrode and between said substrate and said source electrode,
   an input circuit connected between said gate and source electrodes,
   an output circuit including a source of operating potential connected between said drain and source electrodes,
   means connected to said substrate for maintaining said rectifying junctions reversed biased to maintain substantially zero source-to-drain current in the absence of signals applied to said input circuit and to decrease the capacity thereof and thereby increase the speed of response of said switching circuit, and
   means for applying a switching signal to said input circuit to drive said transistor into substantial source-to-drain current conduction.

6. An integrated electrical switching circuit including a plurality of insulated-gate field-effect transistors each having source, drain and gate electrodes formed on a single substrate of semiconductor material comprising:
   an input circuit connected between the gate and source electrodes of a plurality of said transistors,
   an output circuit including a source of operating potential connected between the drain and source electrodes of a plurality of said transistors, means connected to said substrate for maintaining said substrate at a potential with respect to said source and drain electrodes to reduce the source-to-drain current of said plurality of transistors to substantially zero in the absence of signals applied to said input circuit, and means for applying switching signals to said input circuits for driving said transistors into substantial source-to-drain current conduction.

7. An integrated electrical switching circuit including a plurality of insulated-gate field-effect transistors each having source, drain and gate electrodes formed on a substrate of P-type semiconductor material and having rectifying junctions between said substrate and said drain electrodes and between said substrate and said source electrodes, an input circuit connected between the gate and source electrodes of a plurality of said plurality of transistors, an output circuit connected between the drain and source electrodes of a plurality of said plurality of transistors, means for applying a negative voltage to said substrate, said negative voltage being of sufficient value to maintain substantially zero source-to-drain current in said transistors in the absence of signals applied to said input circuit and to reverse bias said rectifying junctions to decrease the capacity thereof, and means for applying a switching signal to said input circuit to drive said transistor into substantial source-to-drain conduction.

References Cited by the Examiner

UNITED STATES PATENTS

| | | | |
|---|---|---|---|
| 2,744,970 | 5/1956 | Schockley | 307—88.5 |
| 3,005,937 | 10/1961 | Wallmark et al. | 307—88.5 |
| 3,010,033 | 11/1961 | Noyce | 307—88.5 |
| 3,109,942 | 11/1963 | Luscher | 307—88.5 |

DAVID J. GALVIN, *Primary Examiner.*

ARTHUR GAUSS, *Examiner.*